United States Patent
Hallak et al.

(10) Patent No.: US 7,453,680 B2
(45) Date of Patent: Nov. 18, 2008

(54) POWER SUPPLY WITH DISCONNECT FUSE

(75) Inventors: Jalal Hallak, Vienna (AT); Harald Schweigert, Vienna (AT)

(73) Assignee: Siemens A G Osterreich, Vienna (AT)

( * ) Notice: Subject to any disclaimer, the term of this patent is extended or adjusted under 35 U.S.C. 154(b) by 0 days.

(21) Appl. No.: 11/811,597

(22) Filed: Jun. 11, 2007

(65) Prior Publication Data

US 2007/0258178 A1 Nov. 8, 2007

Related U.S. Application Data

(62) Division of application No. 10/678,566, filed on Oct. 3, 2003, now Pat. No. 7,268,992.

(51) Int. Cl.
*H02H 9/08* (2006.01)

(52) U.S. Cl. .................................. 361/93.9

(58) Field of Classification Search ............... 361/18, 361/93.9
See application file for complete search history.

(56) References Cited

U.S. PATENT DOCUMENTS

| | | | | |
|---|---|---|---|---|
| 4,669,026 A | * | 5/1987 | Widlar | ............. 361/103 |
| 4,763,220 A | * | 8/1988 | Belbel et al. | ........... 361/93.8 |
| 5,091,614 A | * | 2/1992 | Yamamoto et al. | ......... 218/143 |
| 5,187,632 A | * | 2/1993 | Blessing | ............. 361/103 |
| 5,737,160 A | | 4/1998 | Duffy | |
| 5,805,393 A | | 9/1998 | Thomas | |
| 5,864,458 A | * | 1/1999 | Duffy et al. | ........... 361/93.9 |
| 5,969,514 A | | 10/1999 | Merrill | |
| 6,157,089 A | | 12/2000 | Xu | |
| 2002/0075620 A1 | | 6/2002 | Fischer et al. | |
| 2003/0156365 A1 | | 8/2003 | Kranister et al. | |
| 2005/0168189 A1 | | 8/2005 | Schweigert | |

FOREIGN PATENT DOCUMENTS

DE 3432680 3/1986
WO WO 01/41277 6/2001

OTHER PUBLICATIONS

International Search Report, PCT/AT02/00079, dated Mar. 11, 2002 (3 pages).
Written Opinion, PCT/AT02/00079, dated Feb. 7, 2003 (5 pages) (2 pages translation).
Written Opinion, PCT/AT02/00079, dated May 6, 2003 (6 pages) (3 pages translation).
Supplementary Examination Report, PCT/AT02/00079, dated Jul. 3, 2003 (10 pages) (6 pages translation).

* cited by examiner

*Primary Examiner*—Michael J Sherry
*Assistant Examiner*—Terrence R Willoughby
(74) *Attorney, Agent, or Firm*—Anton P. Ness; Fox Rothschild LLP

(57) ABSTRACT

A power supply in which a feed voltage ($U_s$) is guided through at least one longitudinal branch to at least one output, the at least one branch having a disconnect fuse formed as a controlled semiconductor switch (SW1) and a monitoring unit (UWE) being set up to supply a disconnect signal (s1) to the semiconductor switch when there are changes in voltage or current beyond pre-definable tolerances, in which at least one auxiliary semiconductor switch (H1A), likewise triggered by the monitoring unit (UWE), is connected in parallel to the semiconductor switch (SW1) and in the event of an overload absorbs a substantial portion of the overload current in the branch.

4 Claims, 2 Drawing Sheets

SWITCHED MODE VOLTAGE TRANSFORMER (SPW)
FEED VOLTAGE ($U_S$)
FUSE (Si1), (Si2), (Si3)
CONTROLLED SWITCH (SW1)
MEASURING SHUNT ($R_M1$)
OUTPUT VOLTAGE ($U_{A1}$), ($U_{A2}$), ($U_{A3}$)
OUTPUT ($A_1$), ($A_2$), ($A_3$)

VOLTAGE ($U_{i3}$)
COMPARATOR (KOM)
"AND" GATE (&)
SWITCHING AMPLIFIER (SV3)
MONITORING UNIT (UWE)
LIGHT ($L_1$), ($L_2$), ($L_3$)
REFERENCE VOLTAGE ($U_{Ref}$)

BALLAST RESISTOR ($RA_1$)
AUXILIARY SEMICONDUCTOR
    SWITCH (H1A)
RESISTOR ($RM_1$)
SEMICONDUCTOR SWITCH ($SW_1$)

DISCONNECT SIGNAL ($S_1$)
OUTPUT VOLTAGE ($UA_1$)
FEED VOLTAGE ($U_S$)
ZENER DIODE ($ZD_1$)
SERIES RESISTOR ($RG_1$)

POWER SUPPLY WITH DISCONNECT FUSE

CROSS-REFERENCE TO RELATED APPLICATION

This application is a Divisional application of U.S. patent application Ser. No. 10/678,566 filed Oct. 3, 2003 now U.S. Pat. No. 7,268,992 which in turn claims the benefit of Austrian Patent Application Ser. No. A 560/2001, filed Apr. 6, 2001 and PCT Patent Application Ser. No. PCT/AT 02/00079, filed Mar. 11, 2002.

FIELD OF THE INVENTION

The invention relates to a power supply in which a feed voltage is routed via at least one series arm to at least one output, the at least one arm having a disconnect fuse formed as a controlled semiconductor switch and a monitoring unit being set up to send a disconnect signal to the semiconductor switch in the event of changes in voltages or currents past given tolerance values.

BACKGROUND OF THE INVENTION

In industrial systems and in automated systems, it is of particular significance that the feed voltages of the individual loads or load groups are supplied according to special safety criteria. In particular, it is of primary importance that information processing parts of a control system, such as microprocessor subassemblies, must be supplied with the needed power in the event of a power failure. In many industrial applications, the feed voltage is 24 volts d.c., but other d.c. values are also typical, and even a.c. voltages, such as 115, 230 or 24 volts, are used.

Short circuits or overloads in partial areas of a control system, for example, in the output peripherals, can easily result in a complete, albeit usually only brief, failure of the feed voltage of the control system, which often leads to a loss of data in the central control units that are supplied by the feed voltage.

The increasing use of switched mode power supplies highlights this problem since, because of the sensitive electronics, the internal control circuits limit the output current to values only slightly higher than the nominal current. There exists in particular the problem that conventional fuses for the individual outputs are unable to disconnect in a sufficiently brief period of time. For rapid disconnection, fuses or circuit breakers often require a multiple of their nominal current. However, the switched mode power supplies cannot supply this in addition to the remaining load, so that the total feed voltage bursts in—even before a fuse triggers and the faulty output or branch is cleared.

According to the older application PCT/AT 00/00318 of the applicant, the use mentioned at the outset of controlled semiconductor switches is therefore provided. A circuit of this type is explained below in relation to FIG. 1.

According to FIG. 1, a switched mode voltage transformer SPW supplies an output or feed voltage $U_s$, for example 24 volts, to ground. Such voltage transformers or switched mode power supplies are known to one skilled in the art in a multitude of designs and in and of themselves do not constitute the subject matter of the present invention. For the most part, an input a.c. voltage, for example 230 volts, is rectified and the resulting d.c. voltage is fed via a cycled switch to a primary winding of a transformer. A rectification of the feed voltage is repeated in secondary circuit. Voltage transformer SPW operates, for example, as flyback or flux converter and is usually regulated to a constant output voltage. However, it must be emphasized that the invention is not confined to specific transformers and that the feed voltage, for example can also be a regulated or unregulated a.c. voltage.

Feed voltage $U_s$ is fed to a first output $A_1$ via a conventional fuse Si1 a controlled switch SW1 and via a measuring shunt RM1. Output voltage $U_{A1}$ is applied to output A1. In the same manner, feed voltage $U_s$ is fed to an output $A_2$ and an output $A_3$. Fuses $S_i1$-$S_i3$ are, for example, fusible cutouts and are provided primarily if this calls for standard safety determinations, primarily for fire protection. However, they are not of any significance for the function of the invention.

Fed to a monitoring unit UWE are, on the one hand, feed voltage $U_s$, which is compared in a comparator KOM to a reference voltage $U_{Ref}$, and, on the other hand, any of the voltages occurring on the measuring shunts that are proportional to the output voltages, for example $U_{i3r}$, for the comparison in switching amplifiers, for example $SV_3$. The shown circuit, when connected to a sequencing control (not shown), makes it possible to selectively disconnect outputs, when the feed voltage bursts in, according to predetermined priorities or to disconnect individual branches in the event of an overload. It is also possible to additionally or alternatively monitor the output voltages $U_{A1}$ . . . $U_{A3}$ and to call on them for disconnect operations. The control state in question may be indicated, for example, by little lights L1 . . . L3.

During normal operation, a switching transistor of a long branch is in an operating state in which only a slight drop in voltage occurs; that is, the transistor is in saturation when there is a longitudinal voltage of, for example, clearly under one volt. Accordingly, the power dissipation of the transistor is not all that great. The cooling unit is also designed for such a continuous power dissipation.

Then, if the limit current is exceeded, the transistor—together with the monitoring circuit—begins to hold the output flow constant in order not to overload the feed source too much and thus provoke a crash of the entire system. The saturation state is left and as a result a high power dissipation is then carried out in the transistor, specifically in the extreme case short circuit current times feed voltage. Because the transistor, for example of the MOSFET type, has already been heated up during normal operation, the absorption of the additional power loss in the limit state is problematic. On top of that, the limit state lasts a short period of time, for example 50-100 ms, then the disconnection occurs. In this short time, the heat cannot at all be passed on to a heat sink and therefore must be absorbed by the transistor chip. In order to prevent destruction of the switching transistor before disconnection, transistors having very large chip surfaces must therefore be used, which results in high costs.

A similar circuit emerges from German Patent No. 299 09 206 U1, which describes a protective device for a low-voltage current distribution system in which each circuit is assigned its own circuit breaker having adjustable current limitation as short-circuit and/or overload protection. The break time of the individual switches may be affected by the longitudinal voltage across these switches.

U.S. Pat. No. 5,969,514 describes a buck converter in which the otherwise typical single switching transistor is implemented using transistors that are connected in parallel with drain and source and are started or not started or triggered as a function of the level of output voltage. Cycled switching transistors are always present in this case; however, the set of problems involving a disconnect fuse, which in principle is only switched on or off, is not present.

SUMMARY OF THE INVENTION

An object of the present invention is thus to provide a power supply in which the problem of expensive overdimensioning of the semiconductor switch no longer exists.

Starting from a power supply of the type mentioned at the outset, this objective is achieved according to the invention in that at least one auxiliary semi-conductor switch is connected in parallel that, in the event of an overload, absorbs a substantial portion of the overload current in the branch.

By employing the invention, the thermal "surge" is thus quickly transferred, before disconnection, onto the auxiliary transistor, which for this purpose is available without the aforementioned preliminary increase in temperature.

In an expedient variant, provision is made for the monitoring unit to be set up to keep the auxiliary semiconductor switch at least substantially disconnected during normal operation, but to switch it on in the event of an overload as the main semiconductor switch is simultaneously disconnected. In this way it is possible to affect the characteristic of the transition from the main switch to the auxiliary switch by appropriate design of the monitoring unit.

It is especially advantageous if a ballast resistor is connected in series with the auxiliary semiconductor switch. In this way, the majority of the heat is dissipated in the ballast resistor and the auxiliary semiconductor switch can be dimensioned for a lower power dissipation and therefore be cheaper. In the process it is advisable if the given short circuit current of the branch is determined essentially by the ballast resistor and the feed voltage so that $R1A \approx U_s/I_{K1}$.

In practice, it is expedient and economical if the semiconductor switches are of the FET type. In this manner, the triggering by the monitoring unit may be simplified. In so doing an especially simple solution in terms of circuitry is achieved if the semiconductor switches are of the self-locking FET type, the gate of the main semiconductor switch being connected to the source and triggered by an output of the monitoring unit via a Zener diode, and the gate of the auxiliary semiconductor switch being directly triggered by the same output. A ballast resistor, which is formed as a composite carbon resistor, is especially well-suited to absorb the power impulse that occurs when there is a disconnection.

BRIEF DESCRIPTION OF THE DRAWINGS

The invention, together with additional advantages, is explained in detail below in relation to embodiments that are presented as examples in the drawing. In them.

DETAILED DESCRIPTION OF THE INVENTION

Figure 1:
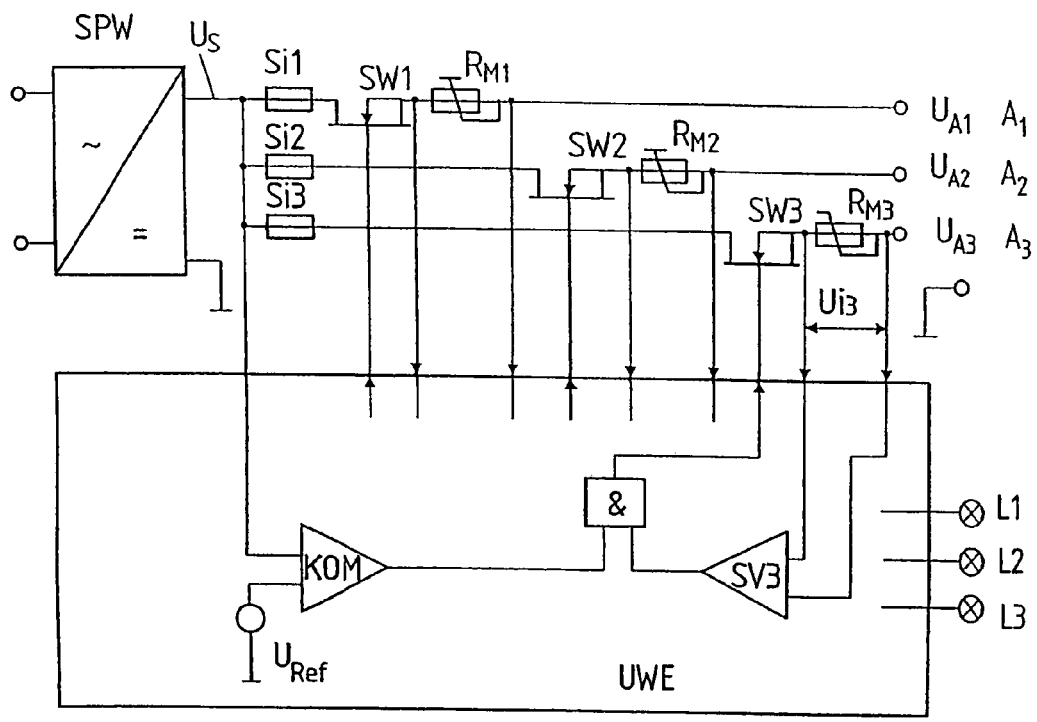
FIG. 1 shows a circuit of a power supply of the older application PCT/AT 00/00318, as already described above.
Figure 2:
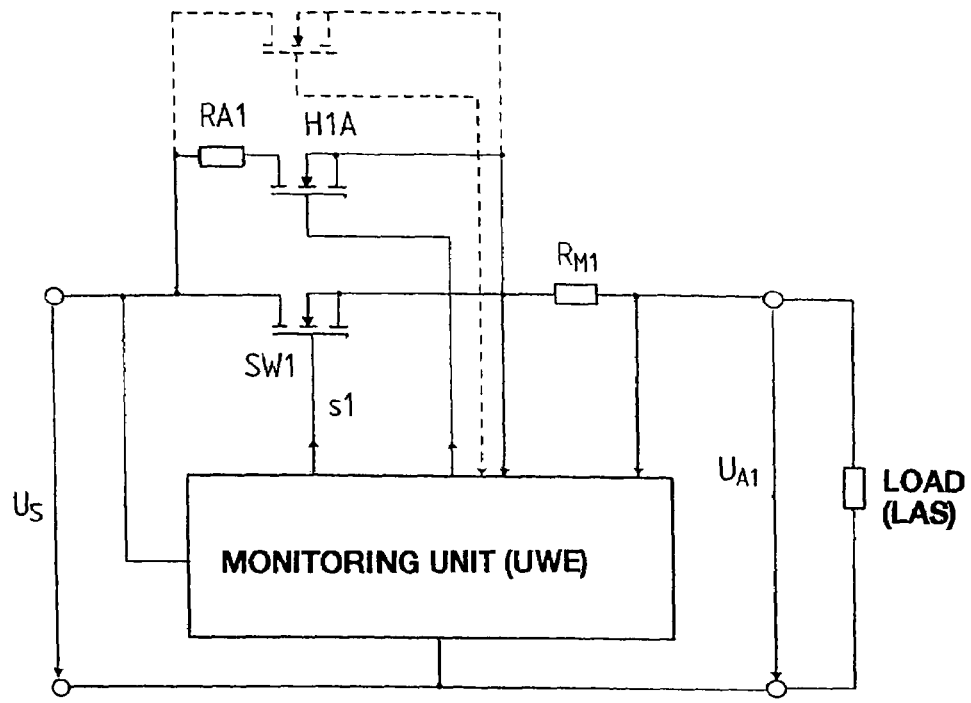
FIG. 2 shows a circuit of a first embodiment of the invention.

According to FIG. 2, which concerns only one branch of a circuit according to FIG. 1, load LAS is connected across a semiconductor switch SW1, in this case a self-locking n-channel IGFET, to feed voltage $U_s$. As already explained with respect to FIG. 1, a monitoring unit UWE, by corresponding signal to the gate of switch SW1, provides for the opening of the latter if, for example, the current measured using resistor $R_{M1}$ exceeds a pre-defined maximum value. Variants of the disconnection conditions are possible, for example, a disconnection as a function of the output voltage or input voltage and combinations of such disconnection conditions.

The basic function of such an electronic fuse is to prevent a current of any given size from being able to flow through a branch. In reality, this is the typical function of a circuit breaker, with the additional characteristic that an operating state of the current limitation is still picked up before complete interruption of the current feed.

A system having several load branches that are supplied via an electronic fuse of this type is protected in this manner from a breaking in of the entire service voltage.

As mentioned, a disconnection of the individual branches may be carried out according to a pre-defined sequence, for example, in reaction to a drop in feed voltage $U_s$, for example, 24 V.

In addition, it may also be provided that, when a specific value of the feed voltage, e.g., 22 V, is undershot, that/those output(s) are disconnected that are routing more than 100% of the reference current at the moment when the threshold is undershot.

The invention then provides that an auxiliary semiconductor switch H1A, in the present case of FIG. 2 also a self-locking n-channel field-effect transistor, is connected in parallel to semiconductor switch SW1. In this case another ballast resistor RA1, which, however, may also be eliminated as will be explained later, is connected in series with auxiliary switch H1A.

During normal operation, switch SW1 is conductive and the total current flows essentially through switch SW1 and through measuring shunt $R_{M1}$ into load LAS'. In the event of a short circuit, a state similar to a short circuit or very generally when exceeding the pre-defined maximum current, the appropriately high current would flow until disconnection, for which a time period of, for example, 50-100 ms may be provided. In order to prevent destruction of switch SW1, which has already been heated up during normal operation, transistor SW1 is locked in the event of an overload and the current then flows through auxiliary switch H1A and ballast resistor RA1 until auxiliary switch H1A also receives a disconnect (lock) signal from monitoring unit UWE.

Assuming that ballast resistor RA1 has a comparatively higher resistance value than the forward resistance of switches H1A and SW1, the essential energy is dissipated in ballast resistor RA1 up until disconnection. In this way, not just main switch SW1 is protected against thermal destruction—it was already disconnected—but also auxiliary switch H1A.

Resistance RA1 also makes it possible, provided that there is a proper dimensioning, that auxiliary switch H1A may also remain continuously switched on during normal operation. This is the case anyway if the series circuit of ballast resistor RA1—auxiliary switch H1A (switched on) has a resistance value that is greater than the forward resistance of main switch SW1. In practice, such as in the case of current limitation, approximately 80% of the leakage power occurring in ballast resistor RA1 was dissipated.

In an exemplary embodiment, the feed voltage is 24 V and the maximum short circuit current is 13 A. The total resistance of the auxiliary branch then turns out to be $$R_{ges} = 24V/13 A = 1.84 \text{ Ohm}$$

The resistance of auxiliary switch $R_{on}$ is, for example, 0.1 Ohm so that ballast resistance RA1 turns out to be 1.74 Ohm. For example a more expensive transistor having a value $R_{on}$ of, for example, 5 mOhms is selected for main switch SW1, which has to guide the continuous current. Especially expedient is a composite carbon resistor, because one like this is substantially more robust than a sheet resistor or wire-wound resistor.

In FIG. 2 an additional FET switch, which is connected in parallel to main switch SW1, is indicated by dashed lines. Thus, expression is given to two different kinds.

In the first place, such an auxiliary switch H1B may be provided in addition to main switch SW1 and auxiliary switch H1A, in some cases along with a series ballast resistor (not shown), in order to absorb the current surge along with Joulean heat in sequence with auxiliary switch H1A or parallel with it.

Secondly, such an auxiliary switch H1B could be used without ballast resistance in place of the series circuit R1A1-H1A, so that auxiliary switch H1B may absorb the current/heat surge when main switch SW1 is switched off. For this purpose, main switch SW1 and auxiliary switch H1B are to be triggered by monitoring circuit UWE in such a manner that, in the event of an overload, immediately auxiliary switch H1B is switched on and main switch SW1 is switched off.

Figure 3:
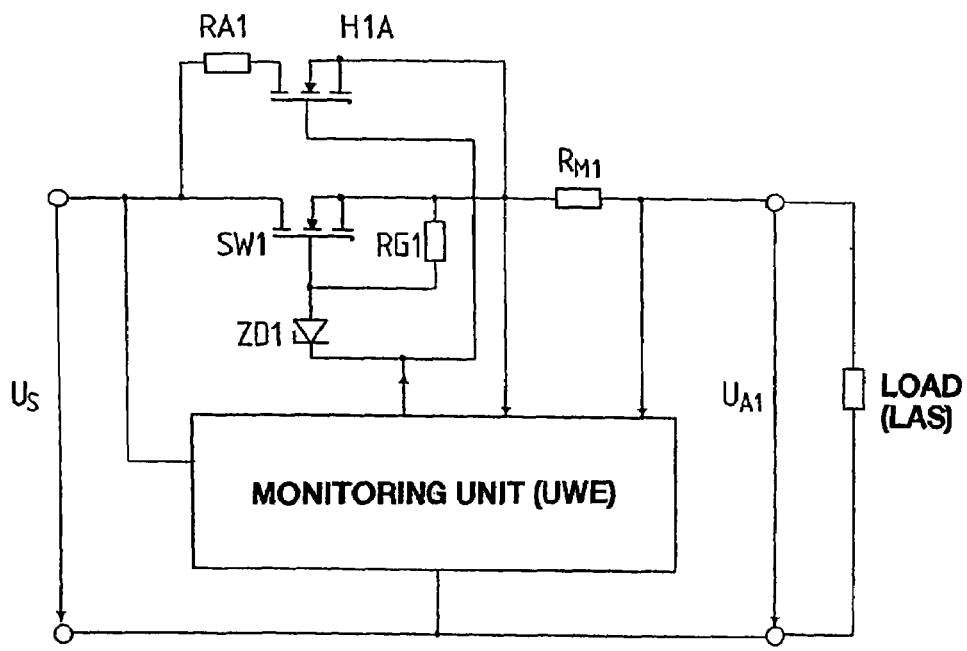
FIG. 3 shows a circuit of a second embodiment of the invention.

The variant according to FIG. 3 represents an especially simple possibility for an automatic triggering of two parallel switches, specifically main switch SW1 and auxiliary switch H1A using a Zener diode, the circuit in other respects corresponding completely to the one according to FIG. 2.

A circuit of this type is indicated especially if the auxiliary switch has a substantially higher internal resistance than the main switch, e.g., $R_{on}$=5 mOhms for the main switch and $R_{on}$=100 mOhms for the auxiliary switch.

Monitoring unit UWE has, for example, an operational amplifying circuit with a PI controller action, so that it acts like the drive unit of an electronic power source. As long as the limit current has not been reached, the monitoring unit or its operational amplifier attempts to increase the limit current even more by further increasing the gate voltage of the switches or transistors SW1, H1A.

Because the output current of the power supply is determined by connected load LAS, the output of the aforementioned operational amplifier during normal operation will remain in positive saturation, for example, at 15 volts. Upon exceeding the set limit current—this may be, for example, 130% of the nominal current that set using a potentiometer on a dial—the operational amplifier becomes active and monitoring unit UWE then lowers its output signal, namely the gate voltage of MOSFET transistors SW1, H1A in order not to allow the output current to increase further.

As is evident, the output of monitoring circuit UWE is directly connected to the gate of auxiliary switch H1A and connected via a Zener diode ZD1 to the gate of main switch SW1. The gate voltage of the main switch, because of the Zener diodes, then reaches the threshold voltage earlier, that is, the voltage at which an FET becomes significantly more resistant even when the gate voltage drops only slightly, in other words, the beginning of the linear operational state in which the transistor acts like a variable resistor. In this way it is ensured that auxiliary transistor H1A in the limit case always absorbs as much current from main switch SW1 as allowed by its own internal resistance and ballast resistor RA1, which is connected in series.

During normal continuous operation, the control voltage generated by monitoring unit UWE, that is, the voltage fed to the gates of the switch, is to be dimensioned in such a manner that main switch SW1 may be fully enabled, but auxiliary switch H1A is not destroyed. In practice one obtains a favorable dimensioning if the Zener voltage of diode ZD1 roughly corresponds to the threshold voltage, that is, approximately 3 volts, of the transistors that are used, in this case the MOSFET transistors.

The integral portion of the control characteristic of monitoring unit UWE is also expedient in order to compensate for the vacillation point when crossing over the Zener diode threshold without excessive deviations of output voltage UA1.

The invention claimed is:

1. A power supply in which a feed voltage ($U_s$) is routed through at least one longitudinal branch to at least one output, the at least one branch having a disconnect fuse formed as a controlled main semiconductor switch (SW1) and a monitoring unit (UWE) being set up to supply a disconnect signal (s1) to the semiconductor switch when there are changes in voltage or current beyond pre-defined tolerances,
wherein
the controlled main semiconductor switch (SW1) is addressed with said disconnect signal (s1) if the limit current is exceeded, so that the controlled main semiconductor switch (SW1) leaves the saturation state and holds the output flow constant in a limit state for a short period of time, and
wherein
at least one series circuit of an auxiliary semiconductor switch (H1A), likewise triggered by the monitoring unit (UWE), and a ballast resistor (RA1), is connected in parallel to the semiconductor switch (SW1), the monitoring unit (UWE) being configured to keep the auxiliary switch (H1A) continuously switched on during normal operation, but in the event of a short circuit or a state similar to a short circuit to lock the semiconductor switch (SW1) and to lock the auxiliary switch (H1A) via a disconnect signal after the short period of time.

2. The power supply as described in claim 1, wherein a pre-defined short-circuit current ($I_{K1}$) of the branch is essentially determined by the ballast resistor (RA1) and the feed voltage (Us), so that $RA1 \approx U_s/I_{K1}$.

3. The power supply as described in claim 1 wherein the semiconductor switches (SW1,H1A) are of the FET type.

4. The power supply as described in claim 1, wherein the ballast resistor (RA1) is formed as a composite carbon resistor.

* * * * *